US007145820B2

(12) United States Patent
Kwack et al.

(10) Patent No.: US 7,145,820 B2
(45) Date of Patent: Dec. 5, 2006

(54) SEMICONDUCTOR MEMORY DEVICE FOR REDUCING CHIP AREA

(75) Inventors: Seung-Wook Kwack, Ichon-shi (KR); Jong-Tae Kwak, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 47 days.

(21) Appl. No.: 11/019,675

(22) Filed: Dec. 23, 2004

(65) Prior Publication Data

US 2006/0133168 A1 Jun. 22, 2006

(30) Foreign Application Priority Data

May 6, 2004 (KR) ...................... 10-2004-0031873

(51) Int. Cl.
*G11C 7/00* (2006.01)

(52) U.S. Cl. ...................................... 365/203; 365/222

(58) Field of Classification Search ................ 365/203, 365/222, 233

See application file for complete search history.

(56) References Cited

U.S. PATENT DOCUMENTS 6,178,130 B1 * 1/2001 Tsern et al. ................. 365/222
6,343,036 B1 1/2002 Park et al.
6,597,616 B1 * 7/2003 Tsern et al. ................. 365/222
6,661,721 B1 * 12/2003 Lehmann et al. ........... 365/203
6,740,433 B1 5/2004 Senner
2004/0006665 A1 1/2004 Moss

FOREIGN PATENT DOCUMENTS

| | | | |
|---|---|---|---|
| JP | 11-045570 | | 2/1999 |
| KR | 10-0184510 | B1 | 12/1998 |
| KR | 10-2002-0008878 | A | 2/2002 |

* cited by examiner

*Primary Examiner*—Vu A. Le
(74) *Attorney, Agent, or Firm*—McDermott Will & Emery LLP

(57) ABSTRACT

Disclosed is a semiconductor memory device capable of reducing chip area by precharging all banks simultaneously. The semiconductor memory device includes: a command decoder for generating an auto refresh signal in response to an external command; an active information signal generator for generating an active information signal in response to a bank grouping signal when the auto refresh signal is activated; a tRAS controller for generating a tRAS control signal for each bank in response to an activated bank active detection signal, wherein the tRAS control signal maintains an active state during a row active time; a precharge information signal generator for generating a precharge information signal in response to the tRAS control signal of a last activated bank; and a bank control signal generator for generating a bank active signal in response to the active information signal and generates a bank precharge signal in response to the precharge information signal, respectively.

4 Claims, 4 Drawing Sheets

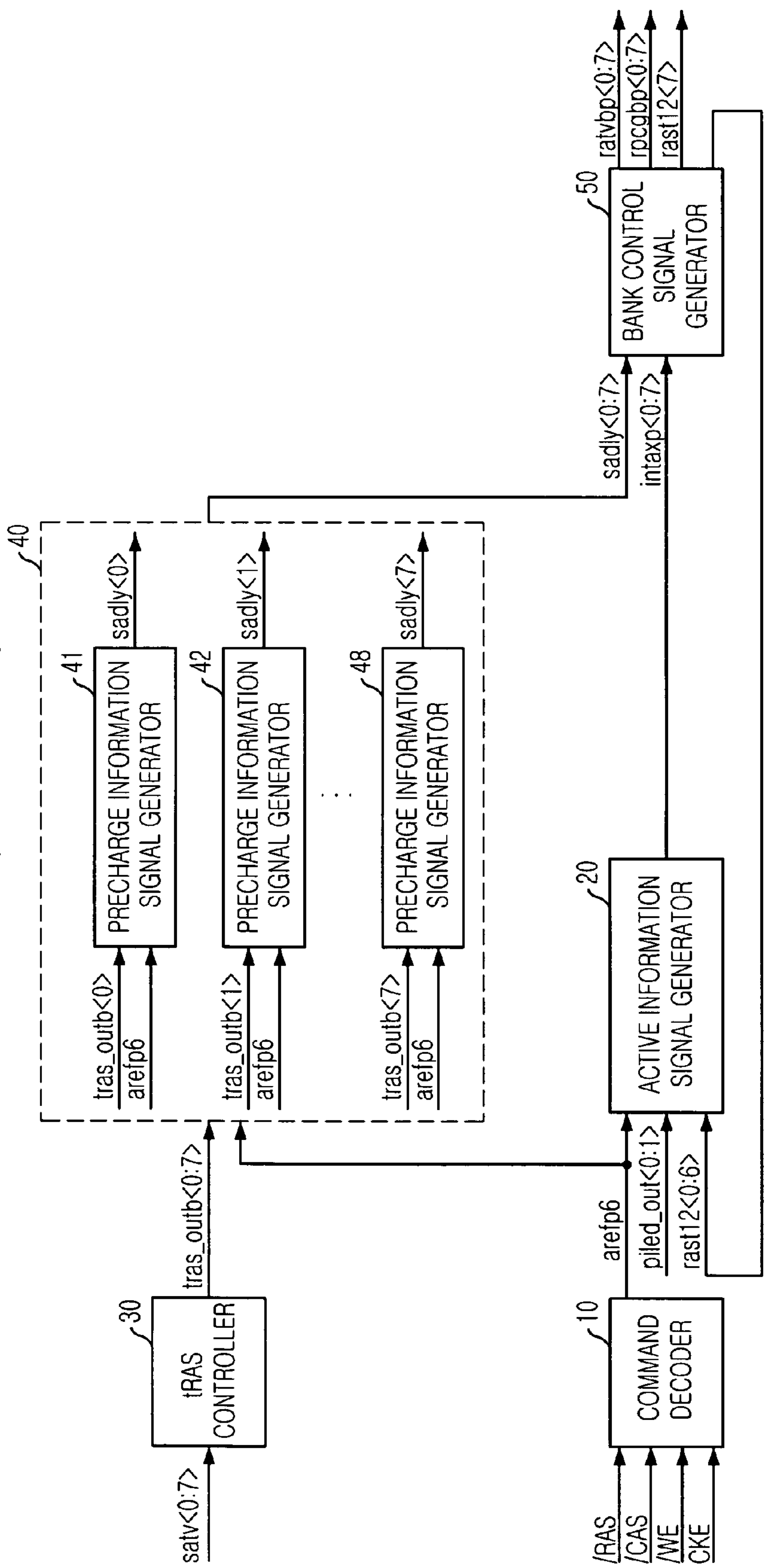
FIG. 1
(PRIOR ART)
40
41
PRECHARGE INFORMATION SIGNAL GENERATOR
tras_outb<0>
arefp6
sadly<0>
42
PRECHARGE INFORMATION SIGNAL GENERATOR
tras_outb<1>
arefp6
sadly<1>
48
PRECHARGE INFORMATION SIGNAL GENERATOR
tras_outb<7>
arefp6
sadly<7>
30
tRAS CONTROLLER
satv<0:7>
tras_outb<0:7>
10
COMMAND DECODER
/RAS
/CAS
/WE
CKE
arefp6
piled_out<0:1>
rast12<0:6>
20
ACTIVE INFORMATION SIGNAL GENERATOR
intaxp<0:7>
sadly<0:7>
50
BANK CONTROL SIGNAL GENERATOR
ratvbp<0:7>
rpcgbp<0:7>
rast12<7>

500
BANK CONTROL SIGNAL GENERATOR
ratvbp<0:7>
rpcgbp<0:7>
rast12<7>
sadly<7>
intaxp<0:7>
400
PRECHARGE INFORMTATION SIGNAL GENERATOR
200
ACTIVE INFORMATION SIGNAL GENERATOR
tras_outb<7>
arefp6
piled_out<0:1>
rast12<0:6>
300
tRAS CONTROLLER
100
COMMAND DECODER
satv<0:7>
/RAS
/CAS
/WE
CKE

SEMICONDUCTOR MEMORY DEVICE FOR REDUCING CHIP AREA

FIELD OF INVENTION

The present invention relates to a semiconductor device; and, more particularly, to a double data rate Π synchronous dynamic random access memory (DDR Π SDRAM) for precharging all banks simultaneously and reducing a chip area.

DESCRIPTION OF PRIOR ART

As is well known, since data stored in a dynamic random access memory (DRAM) device are destroyed after being idle for a predetermined time period, the DRAM device requires refresh cycles to restore the data in the DRAM unlike a static random access memory (SRAM) or a flash memory. That is, memory cells in the DRAM must be periodically refreshed within a predetermined period of time. This time period is referred to as “retention time”. Depending on a technology and a chip temperature, the retention time may vary in the range of a few milli-seconds to hundreds of milli-seconds. Data refresh is accomplished by accessing each row in memory arrays, one row at a time. When memory arrays are accessed to be refreshed, data stored in the memory cells are read to sense-amplifiers, and immediately written back to the memory cells. A capacitor corresponding to each memory cell is thus recharged to its initial value. Such required refresh cycles in the DRAM cause significant delay due to inaccessibility of data in the DRAM while rows of the memory arrays are in the middle of refresh cycles. In other words, during the time that memory cells of DRAM cache memory are refreshed, no other operation can take place in that area of the memory cell.

There are two different refresh operations depending on the mode of the DRAM operation: one is an auto refresh mode; and the other is a self refresh mode. The self refresh mode is performed when the DRAM is not in a normal mode, i.e., the DRAM does not perform a data access. The auto refresh operation, however, is performed when the DRAM is in the normal mode.

In the auto refresh mode, if an auto precharge command or an auto refresh command is inputted to the DRAM, a row active operation and a precharge operation have to be performed within a predetermined time. Hereinafter, required time for the row active operation is referred as a row active time tRAS, and required time for the precharge operation is referred as a precharge time tRP.

While the DRAM operates, the row active time tRAS is a time period when the row active signal is activated becoming a logic ‘HIGH’ level within a cycle of the RAS, and the precharge time tRP is a time period when the row active signal is deactivated becoming a logic ‘LOW’ level within the cycle of the tRAS.

FIG. 1 shows a block diagram setting forth a sequential auto refresh operation which is performed in a prior art semiconductor memory device.

Referring to FIG. 1, the prior art semiconductor memory device performing a sequential auto refresh operation includes a command decoder 10, an active information generator 20, a tRAS controller 30, a precharge information signal generator 40 and a bank control signal generator 50. Herein, the command decoder 10 outputs an auto refresh signal arefp6 after decoding a row address strobe (RAS) bar signal /RAS, a column address strobe (CAS) bar signal /CAS, a write enable bar signal /WE and a clock enable signal CKE.

The active information signal generator 20 generates an active information signal intaxp<0:7> in response to a bank grouping signal piled_out<0:1> when the auto refresh signal arefp6 is activated. The tRAS controller 30 generates a tRAS control signal tras_outb<0:7> in response to a bank active detection signal satv<0:7>, wherein the tRAS control signal tras_outb<0:7> keeps an active state during a row active time and the bank active detection signal detects whether or not each bank is activated.

The precharge information signal generator 40 generates a plurality of precharge information signals sadly<0:7> by detecting a transition state of the tRAS control signal tras_outb<0:7> of each bank when the auto refresh signals arefp6 are activated. The bank control signal generator 50 generates a plurality of bank active signals ratvbp<0:7> in response to the active information signals intaxp<0:7> so as to generate a plurality of bank precharge signals rpcgbp13<0:7> in response to the precharge information signals sadly<0:7>.

The precharge information signal generator 40 has a plurality of precharge information signal generators 41 to 48, for generating the precharge information signals sadly<0:7>, according to the prior art.

FIG. 2 shows a timing diagram setting forth the sequential auto refresh operation of the prior art semiconductor memory device.

Referring to FIG. 2, the command decoder 10 decodes the external commands, i.e, the RAS bar signal /RAS, the CAS bar signal /CAS, the write enable bar signal /WE and the clock enable signal CKE so as to activate the auto refresh signals arefp6. Thereafter, the active information signal generator 20 activates the active information signal intaxp<0:7> having information about a starting point when each bank is activated, in response to the auto refresh signal arefp6. Herein, the number of the active information signal may be changed according to the bank grouping signals piled_out<0:1>. In addition, the active information signal generator 20 generates the bank active signals ratvbp<0:7> with predetermined pulses in response to the active information signals intaxp<0:7>.

Subsequently, the tRAS controller 30 activates the tRAS control signals tras_outb<0:7> in response to the activation state of the bank active detection signals satv<0:7> and maintains the activation period of the tRAS control signals tras_outb<0:7> corresponding to the row active time. Herein, the bank active detection signals satv<0:7> play a role in informing the activation state of each bank. By means of the tRAS controller 30, each bank is activated and then the row active time is guaranteed for a following precharge operation. The respective precharge information signal generator 41 to 48 corresponding to each bank generates a respective precharge information signal sadly<0:7> after detecting a deactivated time of a corresponding tRAS control signal tras_outb<0:7> in response to the activated auto refresh signal arefp6.

Afterwards, the bank control signal generator 50 activates the bank precharge signals rpcgbp<0:7> in response to the precharge information signals sadly<0:7>. In addition, the bank control signal generator 50 activates also information signals rast12<0:7> in response to the active information signals intaxp<0:7> when the bank is activated so that the active information signal generator 20 is used for activating a next bank by the information signals rast12<0:7>.

The bank grouping signal piled_out<0:1> is used for grouping a plurality of banks so as to refresh the grouped bank simultaneously. For example, in case that the banks are not grouped at all, each of eight banks is activated sequentially. In the other case, for example, if two banks are grouped respectively, the group of two banks is simultaneously activated so that four refresh operations are performed. In the present invention, since there are eight banks and the bank grouping signal piled_out<0:1> is 2 bit signal, two banks are simultaneously refreshed at least.

According to the prior art, however, the prior art semiconductor memory device has a drawback because a large chip area is necessarily required. That is, since there are eight precharge information signal generator 41 to 48 in the prior art semiconductor memory device, the prior art semiconductor memory device needs inevitably the large chip area. Moreover, the precharge operation is performed sequentially by each bank so that the control device of precharge operation is too complicated. Furthermore, because the precharge is performed by each bank, the operational speed of the device may be decreased in comparison with all-bank precharge mode.

SUMMARY OF INVENTION

It is, therefore, an object of the present invention to provide a semiconductor memory device for reducing a chip area by precharging all banks simultaneously.

In accordance with an aspect of the present invention, there is provided a semiconductor memory device comprising:

a command decoder for generating an auto refresh signal in response to an external command signal; an active information signal generator for generating an active information signal in response to a bank grouping signal when the auto refresh signal is activated; a tRAS controller for generating a tRAS control signal for each bank in response to an activated bank active detection signal, wherein the tRAS control signal maintains an active state during a row active time; a precharge information signal generator for generating a precharge information signal in response to the tRAS control signal of a last activated bank; and a bank control signal generator for generating a bank active signal in response to the active information signal and generates a bank precharge signal in response to the precharge information signal, respectively.

BRIEF DESCRIPTION OF THE DRAWINGS

The above and other objects and features of the present invention will become apparent from the following description of preferred embodiments taken in conjunction with the accompanying drawings, in which:

FIG. 1 is a block diagram setting forth an auto refresh mode of a prior art semiconductor memory device;

DETAILED DESCRIPTION OF INVENTION

Hereinafter, a semiconductor memory device performing all-bank precharge operation in accordance with the present invention will be described in detail referring to the accompanying drawings.

Figure 2:
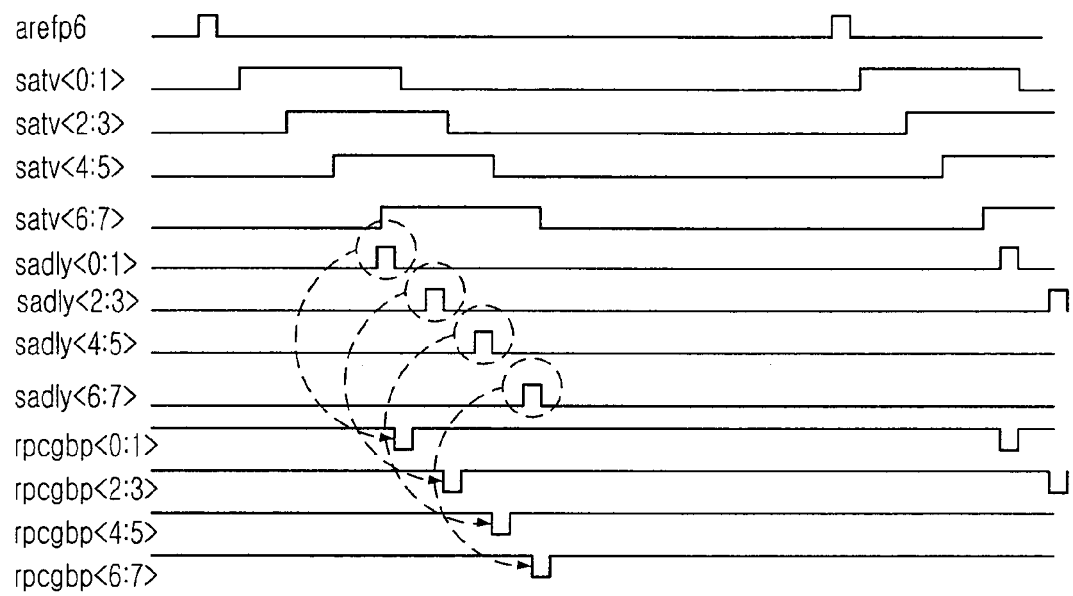
FIG. 2 is a timing diagram illustrating a sequential precharge operation for each bank of the prior art semiconductor memory device.
Figure 3:
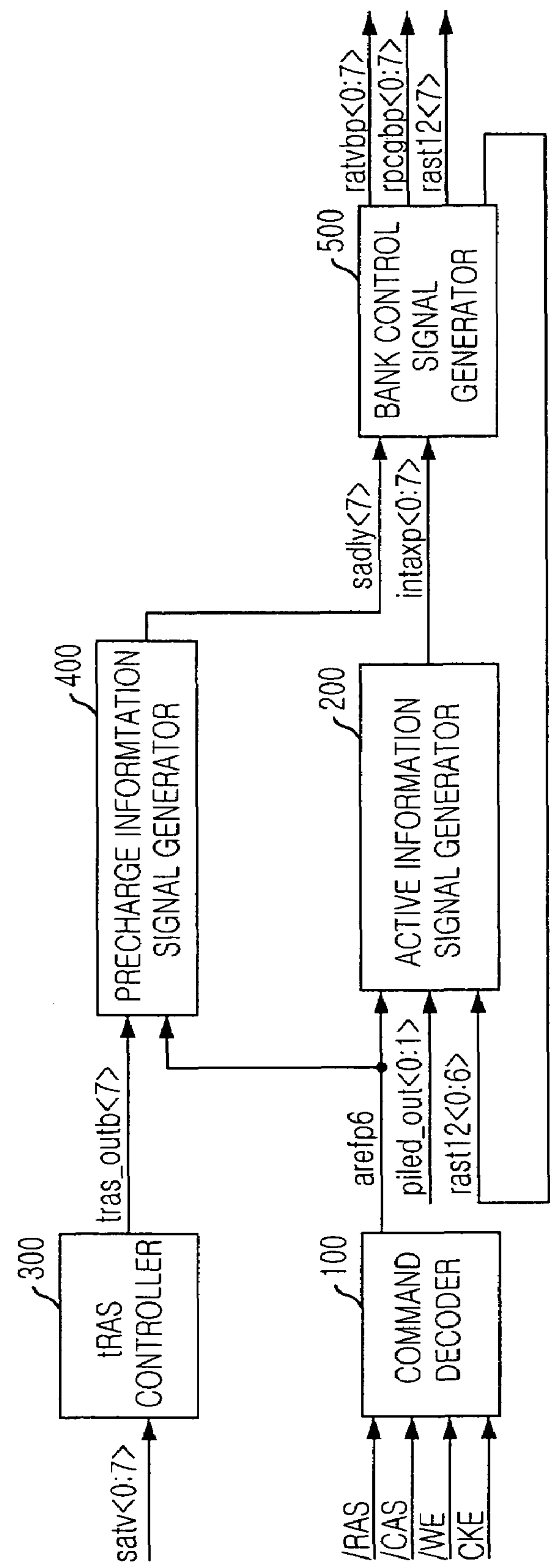
FIG. 3 is a block diagram explaining an auto refresh mode of a semiconductor memory device in accordance with a preferred embodiment of the present invention.

FIG. 3 is a block diagram setting forth a semiconductor memory device performing all-bank precharge in accordance with a preferred embodiment of the present invention.

Referring to FIG. 3, the semiconductor memory device of the present invention includes a command decoder 100, an active information signal generator 200, a tRAS controller 300 in which the tRAS denotes a row active time, a precharge information signal generator 400 and a bank control signal generator 500. Herein, the command decoder 100 generates an auto refresh signal arefp6 after decoding an external command such as a RAS bar signal /RAS, a CAS bar signal /CAS, a write enable bar signal /WE and a clock enable signal CKE. The active information signal generator 200 generates an active information signal intaxp<0:7> in response to a bank grouping signal piled_out<0:1> when the auto refresh signal arefp6 is activated. The tRAS controller 300 outputs a tRAS control signal tras_outb<0:7> of which pulse is maintained during tRAS time, wherein the tRAS control signal tras_outb<0:7> becomes activated as a bank active detection signal satv<0:7> is activated. Herein, the bank active detection signal satv<0:7> informs whether each bank is activated or not. The precharge information signal generator 400 generates a precharge information signal sadly<7> when the auto refresh signal arefp6 is activated, by detecting a transition state of the tRAS control signal tras_out<7> corresponding to a last bank. The bank control signal generator 500 generates a bank active signal ratvbp<0:7> in response to the active information signal intaxp<0:7> and also generates a bank precharge signal rpcgbp13<0:7> in response to the precharge information signal sadly<0:7>, respectively.

In comparison with the prior art, there is only one precharge information signal generator 400 for detecting the transition state of the tRAS control signal tras_outb<7> corresponding to the last bank in the preferred embodiment. Therefore, all banks are simultaneously precharged unlike a sequential precharge operation of the prior art. In addition, since only one precharge information signal generator 400 exists, it is possible to reduce a required chip area of the semiconductor memory device.

Figure 4:
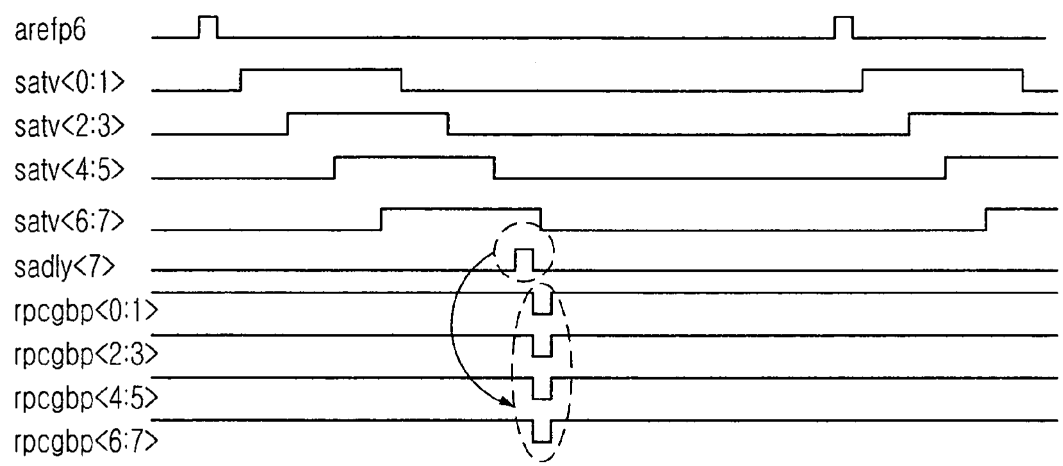
FIG. 4 is a timing diagram depicting an all-bank precharge operation of the semiconductor memory device in accordance with the present invention.

FIG. 4 is a timing diagram setting forth an all-bank precharge operation in the semiconductor memory device in accordance with the preferred embodiment of the present invention.

Referring to FIG. 4, to begin with, when the auto refresh signal arefp6 is activated, the active information signal generator 200 and the bank control signal generator 500 activate each of bank groups sequentially, wherein the bank group incorporates two banks therein in the preferred embodiment.

Subsequently, provided that the bank active detection signal satv<0:7> is activated which denotes active state of each bank, the tRAS controller 300 generates the tRAS control signal tras_outb<0:7> with a predetermined pulse width corresponding to the row active time when each bank is activated. When the tRAS control signal trans_outb<7> corresponding to the last bank is deactivated, the precharge information signal generator 400 detects this state and thus, generates the precharge information signal sadly<7>. Afterwards, the bank control signal generator 500 generates the bank precharge signal rpcgbp<0:7> in response to the precharge information signal sadly<7> so that whole the banks are deactivated.

In the present invention, since all banks are simultaneously precharged in the auto refresh operation mode after guaranteeing the row active time based on a word line of the last activated bank, it is not necessary to install a plurality of the precharge information signal generators which is a demerit of the prior art. Accordingly, it is possible to reduce the required chip area in comparison with the prior art semiconductor memory device because there is only one precharge information signal generator in the present invention.

Furthermore, in accordance with the present invention, it is possible to implement the semiconductor memory device having simple precharge control circuit because all banks are simultaneously precharged. In addition, since whole the banks are precharged at a time, the time required for each bank precharge can be also reduced to thereby enhance the operational speed of the semiconductor memory device in the long run.

The present application contains subject matter related to the Korean patent application No. KR 2004-31873, filled in the Korean Patent Office on May 6, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:

a command decoder for generating an auto refresh signal in response to an external command signal;

an active information signal generator for generating an active information signal in response to a bank grouping signal when the auto refresh signal is activated;

a tRAS controller for generating a tRAS control signal corresponding to a last activated bank in response to an activated bank active detection signal, wherein the tRAS control signal maintains an active state during a row active time;

a precharge information signal generator for generating a precharge information signal in response to the tRAS control signal of the last activated bank; and a bank control signal generator for generating a bank active signal in response to the active information signal and generates a bank precharge signal in response to the precharge information signal, respectively.

2. The semiconductor memory device as recited in claim 1, wherein all banks are precharged simultaneously in response to the precharge information signal.

3. A method for driving a semiconductor memory device, comprising:

a) sequentially activating word lines with a common row address in a first bank to an nth bank;

b) detecting and amplifying a data stored in a memory cell, thereby restoring an amplified data; and c) precharging the first bank to the nth bank simultaneously after a row active time passes from the time that the word line of the nth bank is activated.

4. The method as recited in claim 3, wherein the step c) is performed by using a precharge information signal corresponding to a last activated bank.

* * * * *